(12) United States Patent
Pan et al.

(10) Patent No.: US 8,884,690 B2
(45) Date of Patent: *Nov. 11, 2014

(54) HIGH PERFORMANCE INPUT RECEIVER CIRCUIT FOR REDUCED-SWING INPUTS

(75) Inventors: Dong Pan, Boise, ID (US); Timothy B. Cowles, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/398,041

(22) Filed: Feb. 16, 2012

(65) Prior Publication Data

US 2012/0146718 A1 Jun. 14, 2012

Related U.S. Application Data

(63) Continuation of application No. 12/611,264, filed on Nov. 3, 2009, now Pat. No. 8,125,268, which is a continuation of application No. 11/213,220, filed on Aug. 26, 2005, now Pat. No. 7,622,986.

(51) Int. Cl.
*G06G 7/12* (2006.01)
*G11C 7/10* (2006.01)
*H03F 3/45* (2006.01)

(52) U.S. Cl.
CPC .......... *H03F 3/45179* (2013.01); *G11C 7/1084* (2013.01); *H03F 2203/45684* (2013.01); *G11C 7/1078* (2013.01)
USPC ............................................. 327/563; 327/52

(58) Field of Classification Search
USPC ................. 327/108, 560–563, 50, 52, 170
See application file for complete search history.

(56) References Cited

U.S. PATENT DOCUMENTS

| | | | |
|---|---|---|---|
| 4,528,646 A | 7/1985 | Ochii et al. | |
| 4,638,260 A * | 1/1987 | Hamley | 330/254 |
| 5,291,455 A * | 3/1994 | Feng et al. | 365/226 |
| 5,332,935 A * | 7/1994 | Shyu | 326/71 |
| 5,486,777 A | 1/1996 | Nguyen | |
| 5,825,819 A * | 10/1998 | Cogburn | 375/257 |
| 6,429,735 B1 * | 8/2002 | Kuo et al. | 327/563 |
| 6,456,553 B1 | 9/2002 | Brass et al. | |
| 6,507,245 B2 * | 1/2003 | Tai | 330/255 |
| 6,549,971 B1 | 4/2003 | Cecchi et al. | |
| 6,590,429 B2 * | 7/2003 | Choi et al. | 327/74 |
| 6,747,485 B1 | 6/2004 | Suryanarayana et al. | |

(Continued)

FOREIGN PATENT DOCUMENTS

JP 2004343521 A 12/2004

*Primary Examiner* — Dinh Le
(74) *Attorney, Agent, or Firm* — Dorsey & Whitney LLP

(57) ABSTRACT

An input buffer receiver circuit for electronic devices (e.g., memory chips) to receive reduced-swing and high bandwidth inputs to provide "buffered" output signals having symmetrical rising and falling delays, and without additional current dissipation over previous receiver circuits, is disclosed. The receiver circuit may include two differential amplifier pair stages (i.e., 4 total differential amplifiers). The first stage of differential amplifiers convert the single-ended input signal to a full-differential signal, which is converted back to a single-ended output signal by the second stage of differential amplifiers. The output of a P-diff first stage may be connected to the input of an N-diff second stage and the output of an N-diff first stage may be connected to the input of a P-diff second stage thereby creating a "cross coupled" structure. Various current saving and biasing methods may also be employed to keep operating current the same or lower than previous designs.

22 Claims, 6 Drawing Sheets

(56) References Cited

U.S. PATENT DOCUMENTS

| | | |
|---|---|---|
| 6,857,089 B2 | 2/2005 | Schaber et al. |
| 7,078,935 B2 | 7/2006 | Choi |
| 7,205,234 B2 | 4/2007 | Wu et al. |
| 7,622,986 B2 * | 11/2009 | Pan et al. .......... 327/563 |
| 8,125,268 B2 * | 2/2012 | Pan et al. .......... 327/563 |
| 2002/0158685 A1 | 10/2002 | Suzuki et al. |
| 2010/0052777 A1 | 3/2010 | Pan et al. |

* cited by examiner

HIGH PERFORMANCE INPUT RECEIVER CIRCUIT FOR REDUCED-SWING INPUTS

CROSS REFERENCE TO RELATED APPLICATIONS

This application is a continuation of U.S. patent application Ser. No. 12/611,264, filed Nov. 3, 2009, issued as U.S. Pat. No. 8,125,268, which is a continuation of U.S. patent application Ser. No. 11/213,220 filed Aug. 26, 2005, issued as U.S. Pat. No. 7,622,986. These applications and patents are each incorporated herein by reference, in their entirety, for any purpose.

BACKGROUND

1. Field of the Disclosure

The present disclosure generally relates to electronic circuits and, more particularly, to an input buffer receiver circuit in a memory device to process reduced-swing inputs.

2. Brief Description of Related Art

Memory devices are electronic devices that are widely used in many electronic products and computers to store data. A memory device is a semiconductor electronic device that includes a number of memory cells, each cell storing one bit of data. The data stored in the memory cells can be read during a read operation. FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins or ball contacts 24 located outside of chip 12 for electrically connecting the chip 12 to other system devices. Some of those pins 24 may constitute memory address pins or address bus 17, data (DQ) pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address select (RAS) signal, a column address select (CAS) signal, a chip select (CS) signal, etc. (not shown)) on the control lines or control bus 19. The "width" (i.e., number of pins) of address, data and control buses may differ from one memory configuration to another.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 26. However, these peripheral devices or circuits are not shown in FIG. 1 for the sake of clarity.

The memory chip 12 may include a plurality of memory cells 26 generally arranged in an array of rows and columns. A row decode circuit 28 and a column decode circuit 30 may select the rows and columns, respectively, in the array in response to decoding an address provided on the address bus 17. Data to/from the memory cells 26 are then transferred over the data bus 18 via sense amplifiers and a data output path (not shown). A memory controller (not shown) may provide relevant control signals (not shown) on the control bus 19 to control data communication to and from the memory chip 12 via an I/O (input/output) circuit 32. The I/O circuit 32 may include a number of data output buffers or output drivers to receive the data bits from the memory cells 26 and provide those data bits or data signals to the corresponding data lines in the data bus 18. The I/O circuit 32 may also include various memory input buffers and control circuits that interact with the row and column decoders 28, 30, respectively, to select the memory cells for data read/write operations. A prior art memory input buffer receiver circuit is illustrated in FIG. 2 and discussed later hereinbelow.

The memory controller (not shown) may determine the modes of operation of memory chip 12. Some examples of the input signals or control signals (not shown in FIG. 1) on the control bus 19 include an External Clock (CLK) signal, a Chip Select (CS) signal, a Row Address Strobe (RAS) signal, a Column Address Strobe (CAS) signal, a Write Enable (WE) signal, etc. The memory chip 12 communicates to other devices connected thereto via the pins 24 on the chip 12. These pins, as mentioned before, may be connected to appropriate address, data and control lines to carry out data transfer (i.e., data transmission and reception) operations.

FIG. 2 shows a prior art memory input buffer receiver circuit 34 that may be part of the I/O unit 32 in the memory chip 12 in FIG. 1. It is known to one skilled in the art that although one such circuit 34 is shown in FIG. 2, the I/O unit 32 may include additional such receiver circuits as well. The receiver circuit 34 in FIG. 2 includes a single stage (1-stage) differential amplifier pair. The differential pair includes a P-type differential amplifier (P-diff) 36 and an N-type differential amplifier (N-diff) 38. The P-diff 36 includes two PMOS (P-channel Metal Oxide Semiconductor) transistors 40, 42 as input devices to receive the two inputs—a reference signal (Vref) 41 and an input signal (Vin) 43—as shown in FIG. 2. Whereas, the N-diff 38 includes two NMOS (N-channel MOS) transistors 44, 46 as input devices to receive the same two signals—i.e., Vref 41 and Vin 43 signals—as inputs to the differential amplifier 38. The P-type differential amplifier 36 also includes two additional PMOS transistors 47-48 and two NMOS transistors 49-50 for biasing and signal amplification. The connection of these transistors 47-50 with the input devices 40, 42 is shown in FIG. 2 and, hence, not discussed in detail herein for the sake of brevity. Similarly, the additional transistors in the N-diff amplifier 38 include two PMOS devices 51-52 and two additional NMOS devices 53-54, which are connected to the input devices 44, 46 in the manner shown in FIG. 2. Various biasing voltages (Vcc and ground) are also shown for the circuit components in the receiver circuit 34 of FIG. 2.

It is observed here that one of the input signals to the receiver circuit 34 (i.e., the Vin signal 43) may be any signal (data, address, or control) received from a device (e.g., a memory controller (not shown)) connected to the memory chip 12. The input signals may be received by one or more input buffers (not shown) that may be part of the I/O unit 32 in the memory chip 12. The input buffers, in turn, receive the input signals (Vin) and process them through the input buffer receiver circuits similar to the circuit 34 shown in FIG. 2. The reference signal, Vref 41, may also be applied as an input to the differential amplifiers in the receiver circuit 34 to supply a reference voltage signal against which the deviations in the input signal Vin 43 may be compared. For example, the input signal Vin 43 may be considered as having a "large" input swing when, for example, Vin=Vref±150 mV. That is, a signal swing of 300 mV P-P (peak-to-peak) (in the Vin signal) from the reference voltage Vref may be considered a "large" voltage swing. On the other hand, a swing of 75 mV (e.g., Vin=Vref±75 mV) may be considered a "small" voltage swing. As discussed later hereinbelow, the prior art input buffer receiver circuit 34 does not perform well with reduced swing (e.g., Vref±75 mV) input voltages as compared to input voltages with large or medium swings (e.g., Vref±150 mV).

An output of the differential amplifier 36 is obtained at the junction 56A of the drain terminals of the transistors 42 and 50 as shown in FIG. 2. Similarly, an output of the differential amplifier 38 is obtained at the junction 56B of the drain terminals of the transistors 46 and 52 as shown in FIG. 2. Both of these outputs are combined to form the final output of the differential pair 36, 38. This final output is conveniently referred to herein as the Diff_Out signal 56, which is supplied as an input to an inverting configuration (or inverter) 58 before obtaining an output signal 66 therefrom. The inverter 58 includes a pair of PMOS transistors 59-60 and a pair of NMOS transistors 61-62 connected in the manner shown in FIG. 2 to perform a signal inverting function. The Diff_Out signal 56 may be first inverted by the inverting configuration 58 and then by a logic gate inverter 64 before an output 66 is generated from the input receiver circuit 34. Thus, the output signal 66 may be called a "buffered" version of the input signal Vin 43. Such buffering of the input signal Vin 43 received at an input pin 24 of the memory chip 12 may be necessary, as is known in the art, when the input signal is received over a system bus (e.g., the data bus 18) and it may be desirable to "boost" the signal level of the input signal Vin or to generate a "cleaner" version of the input signal Vin before it is supplied to other components (e.g., a row decode circuit 28, or the column decode circuit 30, etc.) of the memory chip 12 for subsequent processing.

It is observed here that when the input signal Vin 43 has a large (e.g., Vref±300 mV) or medium (e.g., Vref±150 mV) swing, the P-diff 36 and N-diff 38 differential amplifier pair in the input stage 34 will generate an output 66 that having symmetrical rising and falling time delays. However, that may not be the case when Vin is of a reduced-swing (e.g., Vref±75 mV) input. When the input signal Vin 43 has a small swing, the output (Diff_Out 56) of the differential amplifier pair 36, 38 will also have less signal swing due to the limited gain of the differential pair 36, 38. Such limited gain may be present because of a large bias current used to increase the operation speed of the differential pair 36, 38, especially when higher clock frequencies are used in the system.

FIG. 3 shows an exemplary set of waveforms in the 1-stage input receiver of FIG. 2 when the input voltage (Vin 43) has a small swing and when there are PVT (process, voltage, temperature) changes. Two waveforms for the Diff_Out signal 56 are shown in FIG. 3—one waveform 56-1 for the situation when there are no PVT changes, and the other waveform 56-2 represents the situation when there is a PVT change. The other two waveforms in FIG. 3 represent the Out signal 66 at the output of the 1-stage input receiver 34. The waveform numbered 66-1 represents the Out signal 66 that corresponds to the Diff_Out signal 56-1 and is related to the situation when there are no PVT changes. The other waveform numbered 66-2 represents the Out signal 66 that corresponds to the Diff_Out signal 56-2 and is related to the situation when there is a PVT change. As discussed before with reference to FIG. 2, the output signal 66 in the receiver 34 is generated from the Diff_Out signal 56 of the differential amplifier pair 36, 38. Therefore, signal swings in the input voltage Vin 43 may affect the output signal 66 through the Diff_Out signal 56, which is generated based on the levels of the input signal Vin 43.

When PVT varies, the center voltage as well as signal swing (from a given Vref) of the Diff_Out signal 56 varies as can be seen from a comparison of the waveforms 56-1 and 56-2 in FIG. 3. In case of reduced-swing inputs (Vin), the switch point of the second stage inverter 58 cannot track the changes in the Diff_Out signal 56 (here, the waveform 56-2). Because of this, the rising and falling time delays in the resulting output signal 66 are unsymmetrical as can be seen from a comparison of the rising and falling edges in the waveforms 66-1 and 66-2. As mentioned before, the 1-stage input receiver 34 may work fine with inputs (Vin) having large or medium swings, but it suffers from performance degradation when the signal swing becomes very small (e.g., Vin=Vref±75 mV).

It is observed that small signal swing is becoming a trend for high bandwidth signal interconnects in electronic systems (including, for example, systems connecting high-speed memory devices with other electronic components through such interconnects). The reduced signal swing can effectively reduce the power supply noise (which may be present in the input signal, Vin), greatly improving the signal integrity. As noted, modern high speed interconnection between a memory chip (e.g., the memory chip 12) and the chipset on a PCB (not shown) also follows the same trend of employing reduced-swing signals to improve signal integrity. However, as per the discussion hereinbefore, it is seen that the prior art input buffer receiver circuit 34 suffers from performance degradation when the input signal swing is very small.

A small or reduced swing input signal (Vin) with high bandwidth thus requires a sensitive and high speed input receiver. It is therefore desirable to devise an input receiver circuit that has improved performance when the input signal swing is small over PVT corners. It is also desirable that such receiver circuit exhibit similar or comparable performance with the prior art receiver circuit of FIG. 2 when the input signal swing is wide. Further, it is preferable that the current dissipation of the new receiver circuit be the same or less than the current dissipation in the previous receiver of FIG. 2.

SUMMARY

The present disclosure contemplates a method of generating an output signal from an input signal. The method comprises converting the input signal into a full-differential signal using a first pair of differential amplifiers including a first P-type differential amplifier and a first N-type differential amplifier; applying the full-differential signal to a second pair of differential amplifiers including a second P-type differential amplifier and a second N-type differential amplifier; and combining outputs of the second P-type and the second N-type differential amplifiers to generate the output signal.

In one embodiment, the present disclosure further contemplates a method that comprises applying an input signal and a reference signal as two inputs of a first P-type differential amplifier and a first N-type differential amplifier; obtaining a first pair of complementary outputs from the first P-type differential amplifier and a second pair of complementary outputs from the first N-type differential amplifier; and supplying the first pair of complementary outputs as two inputs of a second N-type differential amplifier and the second pair of complementary outputs as two inputs of a second P-type differential amplifier.

In another embodiment, the present disclosure contemplates a method, which comprises receiving a reduced-swing, single-ended input signal; converting the input signal into a full-differential signal; and generating a single-ended output signal from the full-differential signal.

The present disclosure also contemplates an input receiver circuit. The circuit comprises a first pair of differential amplifiers, wherein each differential amplifier in the first pair is configured to receive a pair of inputs and to generate a corresponding pair of outputs therefrom. The circuit also comprises a second pair of differential amplifiers, wherein each differential amplifier in the second pair is coupled to a respective one of the first pair of differential amplifiers and receives the corresponding pair of outputs therefrom as inputs thereto, and wherein a corresponding output of each differential amplifier in the second pair is combined to obtain an output signal.

In an alternative embodiment, the present disclosure contemplates a circuit that comprises a first P-type differential amplifier configured to receive a reference signal and an input signal as inputs thereto and to generate a first and a second outputs therefrom; a first N-type differential amplifier configured to receive the reference signal and the input signal as inputs thereto and to generate a third and a fourth outputs therefrom; a second P-type differential amplifier coupled to the first N-type differential amplifier to receive the third and the fourth outputs as inputs thereto and to generate a first output signal therefrom; and a second N-type differential amplifier coupled to the first P-type differential amplifier to receive the first and the second outputs as inputs thereto and to generate a second output signal therefrom.

An input receiver circuit according to the present disclosure may be part of an electronic device including, for example, a memory device. Such memory devices may be used in various systems including, for example, computing or data processing systems. Such electronic devices and systems are also contemplated in various embodiments of the present disclosure.

An input buffer receiver circuit for electronic devices (e.g., memory chips), designed according to the teachings of the present disclosure, receives and processes reduced-swing and high bandwidth inputs to obtain "buffered" output signals therefrom with symmetrical rising and falling delays, and without additional current dissipation over previous receiver circuits. The receiver circuit may include two stages of differential amplifier pairs (i.e., a total of 4 separated differential amplifiers). The P-diff and N-diff differential amplifiers in the first stage convert the single-ended input signal to a full-differential signal, which is then converted back to the single-ended output signal by the P-diff and N-diff pair in the second stage. The outputs of the first stage P-diff are connected to the inputs of the second stage N-diff and the outputs of the first stage N-diff are connected to the inputs of the second stage P-diff, thereby creating a "cross" coupled structure. Various current saving and biasing methods may also be employed to keep the operating current the same or lower than the previous receiver circuit designs.

Although the previous paragraphs discuss particular configurations involving P and N type differential amplifiers, those of ordinary skill in the art will recognize that any combination of P type differential amplifiers, N type differential amplifiers, combinations of P and N type differential amplifiers, as well as the number of differential amplifier stages, may be employed using the concepts disclosed herein.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to certain embodiments of the present disclosure, examples of which are illustrated in the accompanying drawings. It is to be understood that the figures and descriptions of the present disclosure included herein illustrate and describe elements that are of particular relevance to the present disclosure, while eliminating, for the sake of clarity, other elements found in typical solid-state electronic devices, memories or memory-based systems. It is noted at the outset that the terms "connected", "connecting," "electrically connected," etc., are used interchangeably herein to generally refer to the condition of being electrically connected. It is further noted that various block diagrams and circuit diagrams shown and discussed herein employ logic circuits that implement positive logic, i.e., a high value on a signal is treated as a logic "1" whereas a low value is treated as a logic "0." However, any of the circuits discussed herein may be easily implemented in negative logic (i.e., a high value on a signal is treated as a logic "0" whereas a low value is treated as a logic "1").

Figure 4:
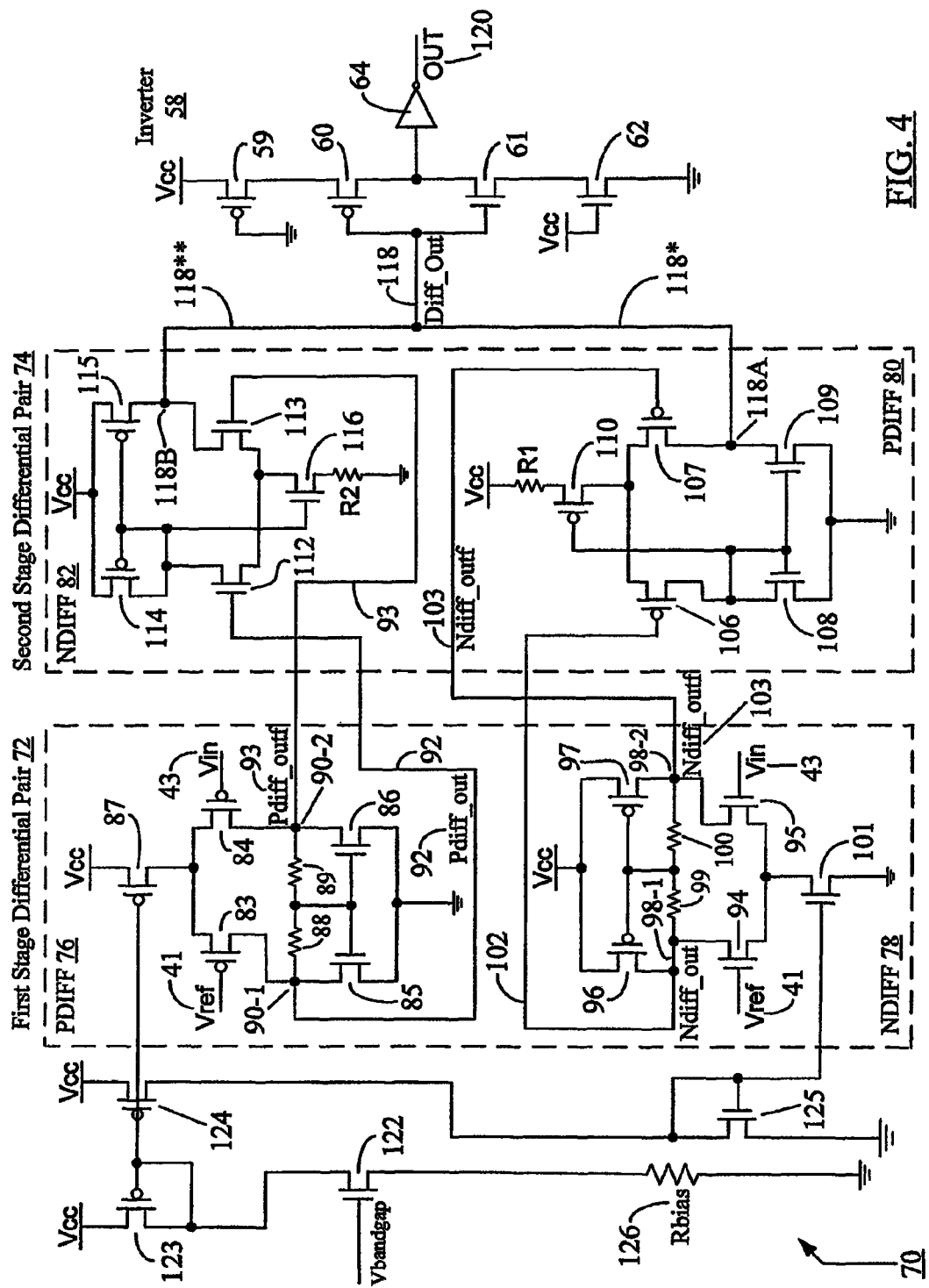
FIG. 4 depicts an exemplary circuit configuration according to one embodiment of the present disclosure for a high performance input receiver circuit for reduced-swing inputs.

FIG. 4 depicts an exemplary circuit configuration according to one embodiment of the present disclosure for a high performance input receiver circuit 70 for reduced-swing inputs. The input buffer receiver circuit 70 may be used, for example, as part of an I/O unit (not shown) in a memory device (not shown in FIG. 4, but shown in FIG. 8). In other embodiments, the receiver circuit 70 may be used in input buffers in other electronic devices. The receiver circuit 70 may include two stages of differential amplifier pairs—the first stage differential pair 72 and the second stage differential pair 74. Each differential pair 72, 74 may include a pair of differential amplifiers—one P-type differential amplifier (P-diff) and one N-type differential amplifier (N-diff). Thus, the first differential pair 72 includes a P-diff 76 and an N-diff 78, whereas the second differential pair 74 includes a separate P-diff 80 and an N-diff 82. The first stage differential pair 72 receives the two external inputs Vref 41 and Vin 43 and generates two pairs of complementary outputs (discussed later hereinbelow), which are then supplied as inputs to the differential amplifiers in the second stage 74. The outputs of the differential amplifiers 80, 82 in the second stage 74 are then combined to obtain the final output signal. Thus, in operation, the P-diff 76 and the N-diff 78 amplifiers in the first stage 72 convert the single-ended input signal Vin 43 into a full-differential signal, which is then converted back to the single-ended signal in the second stage differential pair 74 as discussed in more detail later hereinbelow. A single-ended signal is a signal referenced to ground, or an unbalanced signal. A full-differential signal is, in fact, two signals of opposite polarity.

As shown in FIG. 4, the P-type differential amplifier 76 includes two PMOS transistors 83-84 to receive the external inputs Vref 41 and Vin 43, respectively, at their gate terminals. The drain terminals of transistors 83-84 are connected to the respective drain terminals of NMOS transistors 85-86 (at junction points 90-1 and 90-2, respectively) as shown in FIG. 4. Further, a pair of resistors 88-89 is connected between the junction points 90-1 and 90-2, and the gates of NMOS transistors 85-86 are connected to each other and to the junction of resistors 8889 as shown in FIG. 4. The supply voltage Vcc may be connected to the sources of transistors 8384 through a biasing transistor 87 as shown. The biasing of the amplifiers 76, 78 in the first stage 72 is discussed later hereinbelow. The P-diff amplifier 76 may generate two outputs—a first output (the Pdiff_out signal 92) at the junction point 90-1 and a second output (the Pdiff_outf signal 93) at the junction point 90-2. It is observed here that the two outputs of the P-diff 76 form a pair of complementary outputs—i.e., the Pdiff out signal 92 and the Pdiff outf signal 93 are complementary to each other because of the differential nature of the amplifier 76. The outputs 92-93 of the P-diff 76 are supplied as two inputs to the N-diff 82 in the second stage 74 as shown in FIG. 4 and as discussed later hereinbelow.

Figure 2:
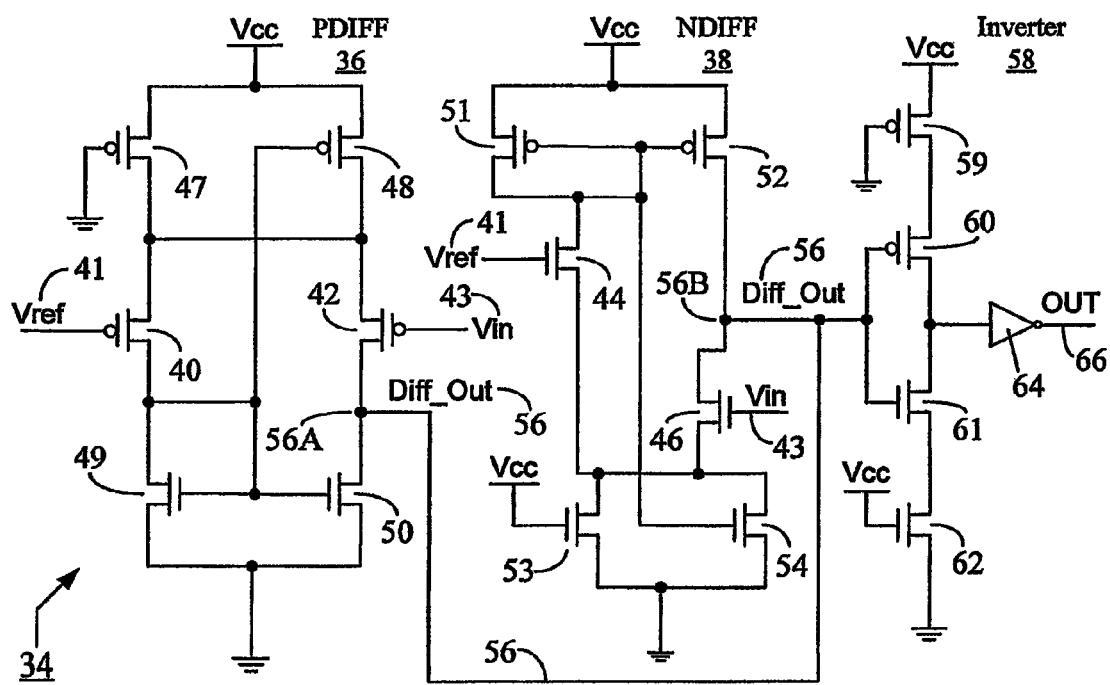
FIG. 2 shows a prior art memory input buffer receiver circuit that may be part of the I/O unit in the memory chip of FIG. 1.

It is noted here that signals or circuit elements similar between the circuits in FIGS. 2 and 4 are referred to by the same reference numerals in both the figures. Thus, for example, the reference voltage signal (Vref) and the input signal (Vin) have the same reference numerals "41" and "43", respectively, in FIGS. 2 and 4. Similarly, the inverting section 58 (and its constituent elements) and the output stage inverter 64 are also referred to by the same reference numerals in FIGS. 2 and 4 for ease of explanation. However, it is known to one skilled in the art that although some of the reference numerals are common between FIGS. 2 and 4, it is not necessary the fact that the circuit elements referred to by the common reference numerals are identical in construction, placement, or orientation in the circuit configurations of FIGS. 2 and 4. Thus, for example, the inverting section 58 in FIG. 4 may be implemented through different circuit elements than the implementation shown in FIG. 2. In short, the usage of common reference numerals for convenience and ease of discussion only; a similar functionality between two component parts may not necessarily mean identity in construction.

The second differential amplifier in the first stage differential amplifier pair 72 is the N-type differential amplifier 78, which includes two NMOS transistors 94-95 that receive the input signals Vref 41 and Vin 43, respectively, at their respective gate terminals. The drain terminal of NMOS 94 is connected to the drain terminal of PMOS 96 as represented by the junction point 98-1. Similarly, the drain of NMOS 95 is connected to the drain of PMOS 97 at the junction point 98-2. The gates of transistors 96-97 are connected together and also to the junction of resistors 99-100 connected between the junctions 98-1 and 98-2 as shown in FIG. 4. The NMOS transistors 94-95 receive their bias supply at their source terminals through a biasing transistor 101 as shown. Like the P-diff amplifier 76, the N-diff amplifier 78 in the embodiment of FIG. 4 may also be configured to generate two complementary outputs—the Ndiff_out signal 102 at the junction 98-1 and the Ndiff_outf signal 103 at the junction 98-3. The outputs 102-103 of the N-diff amplifier 78 are supplied as two differential inputs to the P-diff 80 in the second stage 74 as shown in FIG. 4 and as discussed later hereinbelow. It is noted here that appropriate Vcc and ground connections may be provided for the amplifiers 76, 78, (and also the amplifiers 80, 82 discussed later hereinbelow) as shown in FIG. 4. Because of self-explanatory nature of these connections, additional discussion thereof is not provided herein for the sake of brevity.

As mentioned before, the second stage differential pair 74 includes a P-type differential amplifier 80 and an N-type differential amplifier 82. The P-diff 80 includes two PMOS transistors 106-107 to receive the output signals from the N-diff 78 (i.e., the Ndiff_out 102 and the Ndiff_outf 103 signals) as inputs at their respective gate terminals. Thus, in the embodiment of FIG. 4, the PMOS 106 receives the Ndiff_out signal 102 at its gate terminal whereas the PMOS 107 receives the complementary output, i.e., the Ndiff_outf signal 103 at its gate terminal. The Ndiff_out 102 and the Ndiff_outf 103 signals thus constitute the two differential inputs to the P-type differential amplifier 80. The P-diff 80 further includes two NMOS transistors 108-109 whose drain terminals are connected to corresponding drain terminals of the PMOS transistors 106-107 as shown in FIG. 4. A bias transistor 110 along with a corresponding resistor R1 may also be provided to limit the biasing current in the P-diff 80 as discussed later hereinbelow. The supply (Vcc) and ground voltages, and other transistor terminal connections (among the transistors 106-110) may be as shown in FIG. 4.

Similarly, the N-type differential amplifier 82 may include two NMOS transistors 112-113 to receive the output signals from the P-diff 76 (i.e., the Pdiff out 92 and the Pdiff outf 93 signals) as inputs at their respective gate terminals. Thus, in the embodiment of FIG. 4, the NMOS 112 receives the Pdiff out signal 92 at its gate terminals whereas the NMOS 113 receives the complementary output, i.e., the Pdiff outf signal 93 at its gate terminal. The Pdiff out 92 and the Pdiff outf 93 signals thus constitute the two differential inputs to the N-type differential amplifier 82. The N-diff 82 further includes two PMOS transistors 114-115 whose drain terminals are connected to corresponding drain terminals of the NMOS transistors 112-113 as shown in FIG. 4. A bias transistor 116 along with a corresponding resistor R2 may also be provided to limit the biasing current in the N-diff 82 as discussed later hereinbelow. The supply (Vcc) and ground voltages, and other transistor terminal connections (among the transistors 112-116) may be as shown in FIG. 4.

In the embodiment of FIG. 4, each differential amplifier 80, 82 in the second stage differential pair 74 generates one output signal from the two inputs received from the corresponding differential amplifier in the first stage 72. In case of the P-diff 80, the single output may be obtained at the junction 118A of the drain terminals of the transistors 107 and 109 as shown in FIG. 4 and designated by 118*. Similarly, an output of the differential amplifier 82 may be obtained at the junction 118B of the drain terminals of the transistors 113 and 115 as shown in FIG. 4 and designated by 118. Both of these outputs (at points 118A and 118**B) may then be combined to form the final output of the differential pair 80, 82 (i.e., the final output of the second stage 74). This final output is conveniently referred to herein as the Diff_Out signal 118, which is supplied as an input to the inverting configuration 58 before obtaining an output signal 120 therefrom. It is noted here that although the outputs 118* and 118** are closely related to each other, they may not be exactly identical to each other, but for ease of discussion, the same reference numeral "118" is used to indicate the closeness of the outputs 118* and 118** to the Diff_Out signal 118. The construction of the inverter 58 and its functionality along with the logic gate inverter 64 are already discussed hereinbefore with reference to FIG. 2, and, hence, that discussion is not repeated here for the sake of brevity. In the embodiment of FIG. 4, the output signal 120 may be generated from the receiver circuit 70 when the Diff_Out signal 118 is passed through the series connection of the inverters 58 and 64. As noted before, the output signal 120 may be called a "buffered" version of the input signal Vin 43. It is evident to one skilled in the art that the output signal 120 may be obtained in many other ways from the Diff_Out signal 118. For example, the inverters 58 and 64 may be omitted in one embodiment to present the Diff_Out signal 118 directly as the output of the receiver circuit 70. Similar other design considerations may be applied to generate the output signal 120 from Diff_Out 118.

Figure 3:
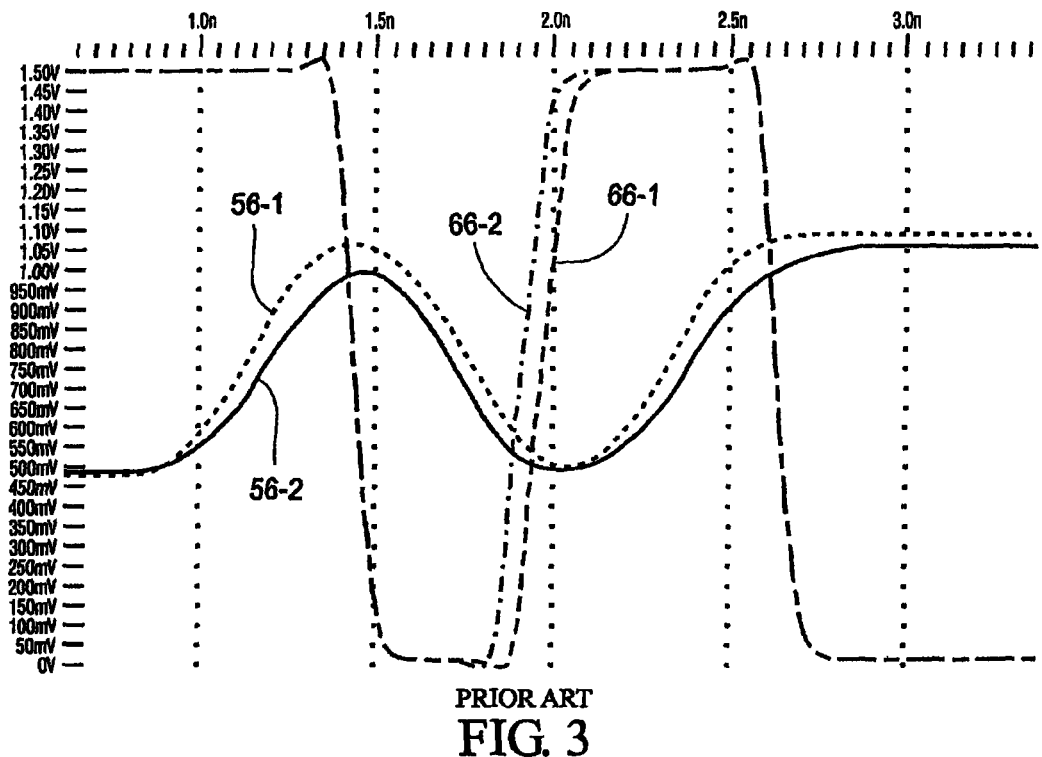
FIG. 3 shows an exemplary set of waveforms in the 1-stage input receiver of FIG. 2 when the input voltage (Vin) has a small swing and when there are PVT changes.
Figure 5:
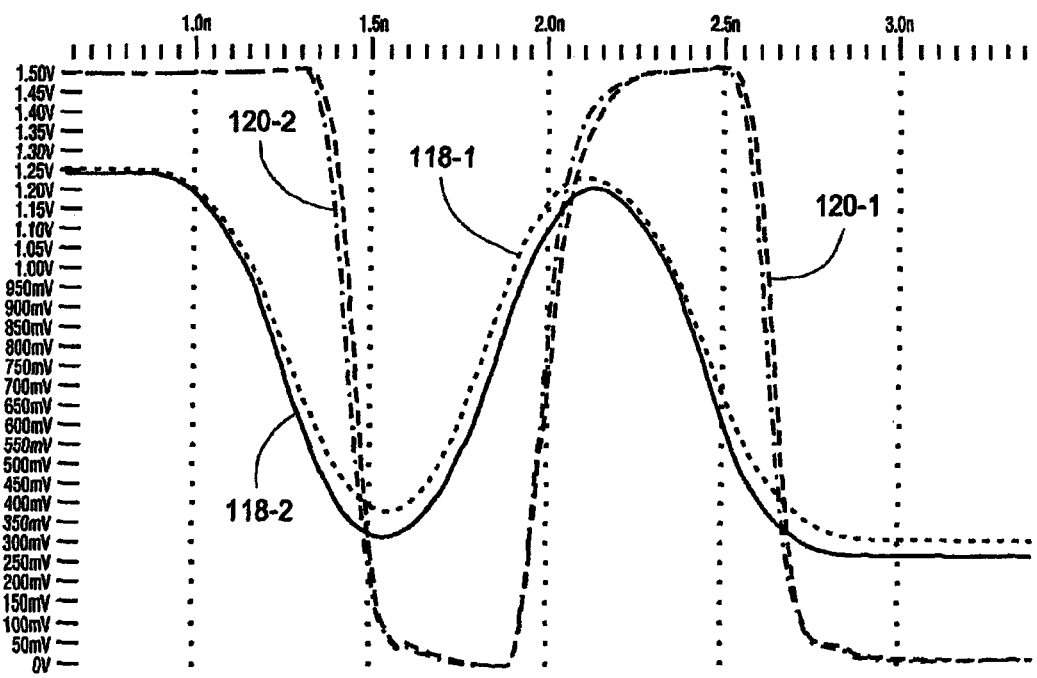
FIG. 5 shows an exemplary set of waveforms in the 2-stage input receiver of FIG. 4 when the input voltage (Vin) has a small swing and when there are PVT changes.

It is observed here that although the same term "Diff_Out" is used herein to refer to the combined output of the second stage 74 as that term was used to refer to the combined output of P-diff 36 and N-diff 38 in FIG. 2, a different reference numeral ("118") is used to refer to the Diff_Out signal from the second stage 74 because of the difference between the Diff_Out signal 118 in the receiver 70 according to one embodiment of the present disclosure and the Diff_Out signal 56 in the prior art receiver 34 as can be seen from a comparison of FIGS. 3 and 5 and as discussed later hereinbelow with reference to discussion of FIG. 5. The different Diff_Out signal 118 in the embodiment of FIG. 4 thus results in generation of a different output signal, which is indicated by reference numeral 120 in FIG. 4 (as distinguished from the reference numeral "66" in FIG. 2). The operation of the receiver circuit 70 for reduced-swing inputs is now described below in conjunction with FIGS. 4 through 7.

As noted before, the first stage differential pair 72 converts the single-ended (or non-differential) input signal Vin 43 to a full-differential signal. That is, the single input signal Vin 43 is converted into a pair of signals Pdiff_out 92 and Ndiff_out 102. The complements of signals 92 and 102 are also generated to provide the second inputs needed for the second stage differential amplifiers 80, 82. The complements may therefore be considered a part of the full-differential signal generated from the single-ended input Vin 43. This conversion into a full-differential signal may be performed using separated P-diff 76 and N-diff 78 amplifiers in the first stage 72. Thereafter, the separated differential amplifiers P-diff 80 and N-diff 82 in the second stage 74 convert back the full-differential signal input to the second stage 74 (from the first stage 72) into the single-ended output signal Diff_Out 118. It is observed here that the differential amplifiers 76, 78 in the first stage 72 are not connected to each other, nor are the differential amplifiers 80, 82 in the second stage 74. In other words, these differential amplifiers 76, 78, 80, 82 may be considered as "separated." By "cross" connecting the outputs (i.e., signals 92-93) of the first stage P-diff amplifier 76 to the inputs of the second stage N-diff amplifier 82 and outputs (i.e., signals 102-103) of the first stage N-diff amplifier 78 to the inputs of the second stage P-diff amplifier 80, the performance and current savings in the receiver circuit 70 may be improved as discussed later.

In the embodiment of FIG. 4, the first stage 72 may provide low output swing and medium gain for high speed operation, whereas the second stage 74 may be designed to function as a large gain stage. Furthermore, the pair of differential amplifiers in the first stage 72 may convert the common mode voltage to a relatively constant voltage (which is not sensitive to the fluctuations in the input voltage Vref 41). The receiver circuit 70 may perform better, especially for reduced-swing inputs (Vin), because the second stage differential pair 80, 82 ends up operating on a larger (500 mV) input signal swing even though the actual input signal swing is small (e.g., Vin=Vref±75 mV). The differential amplifier pair 80, 82 in the second stage 74 is able to generate a better output signal (the Diff_Out signal 118) because each amplifier 80, 82 receives differential input signals rather than two separate, single-ended inputs. Furthermore, because the first stage P-diff 76 outputs are connected to the second stage N-diff 82 and the first stage N-diff 78 outputs are connected o the second stage P-diff 80, the common mode input voltage for the second stage P-diff 80 is different from that for the second stage N-diff 82. That is, the common mode input voltages for the second stage P-diff 80 and N-diff 82 are controlled separately in the first stage 72 because of the use of separate P-diff 76 and N-diff 78 in the first stage 72. Because the second stage common mode input voltage controls the upper and lower limits of the swing in the second stage output (Diff_Out 118), the Diff_Out signal 118 and its swing can be more easily controlled in the circuit configuration 70 of FIG. 4 than in the circuit 34 of FIG. 2, especially when the input signal (Vin) swing is small.

As discussed later in more detail, the bias current for the first stage 72 may be mainly controlled by the bias resistor Rbias 126. Hence, the variation in the bias current (to the first stage 72) due to PVT variations in the resistance of Rbias 126 is proportional to the common mode feedback (CMFB) current variation (which may be controlled by two feedback resistors in each differential amplifier in the first stage 72—i.e., the feedback resistors 88-89 in P-diff 76 and resistors 99-100 in N-diff 78). Thus, the signal swing of the first stage differential output (i.e., the pair of signals Pdiff_out 92 and Ndiff_out 102, or the pair of signals Pdiff_outf 93 and Ndiff_outf 103) remains relatively constant.

It was mentioned before that the common mode input voltage for the second stage 74 may be controlled by the first stage differential pair 72. It may be controlled, in a minor way, by the bias current Ibias, and, in a major way, by the ratio of Vth (threshold voltage) to Ids (drain-source current) for the transistors (more specifically, the PMOS 96-97 in N-diff 78 and NMOS 85-86 in P-diff 76) in the first stage 72. Because the first stage N-diff outputs 102-103 are supplied as the second stage P-diff 80 inputs, the performance of the PMOS devices 96-97 in the first stage N-diff 78 varies in the same direction as the performance of the input PMOS devices 106-107 in the second stage P-diff 80. Similarly, the performance of the NMOS devices 85-86 in the first stage P-diff 76 also varies in the same direction as the performance of the input NMOS devices 112-113 in the second stage N-diff 82. Thus, the overall output of the second stage (i.e., the Diff_Out signal 118) remains unchanged during PVT variations.

Based on various operational details given hereinabove for the circuit configuration 70 in FIG. 4 (e.g., use of separated P-diff and N-diff amplifiers in the first 72 and second 74 stages, the control of common mode input voltage for the second stage 74 by the differential amplifier pair 76, 78 in the first stage 72, etc.), it is seen that the output (Diff_Out 118) of the pair of differential amplifiers 80, 82 in the second stage 74 may be more centered to the switch point of the third stage inverting configuration 58 even when there are PVT changes. Thus, the input receiver circuit 70 according to one embodiment of the present disclosure may exhibit more symmetrical rising and falling delays in the output signal 120 as shown in FIG. 5, which shows an exemplary set of waveforms in the 2-stage input receiver 70 of FIG. 4 when the input voltage (Vin 43) has a small swing and when the PVT changes. Two waveforms for the Diff_Out signal 118 are shown in FIG. 5—one waveform 118-1 for the situation when there is no PVT change, and the other waveform 118-2 represents the situation when there is a PVT change. The other two waveforms in FIG. 5 represent the Out signal 120 at the output of the 2-stage input receiver 70 in FIG. 4. The waveform numbered 120-1 represents the Out signal 120 that corresponds to the Diff_Out signal 118-1 and is related to the situation when there is no PVT change. The other waveform numbered 120-2 represents the Out signal 120 that corresponds to the Diff_Out signal 118-2 and is related to the situation when there is a PVT change. As discussed before with reference to FIG. 4, the output signal 120 in the receiver 70 is generated from the Diff_Out signal 118 of the differential amplifier pair 80, 82. Therefore, signal swings in the input voltage Vin 43 may affect the output signal 120 through the Diff_Out signal 118, which is generated based on the levels of the input signal Vin 43 supplied to the amplifiers 76, 78 in the first stage 72.

Figure 6:
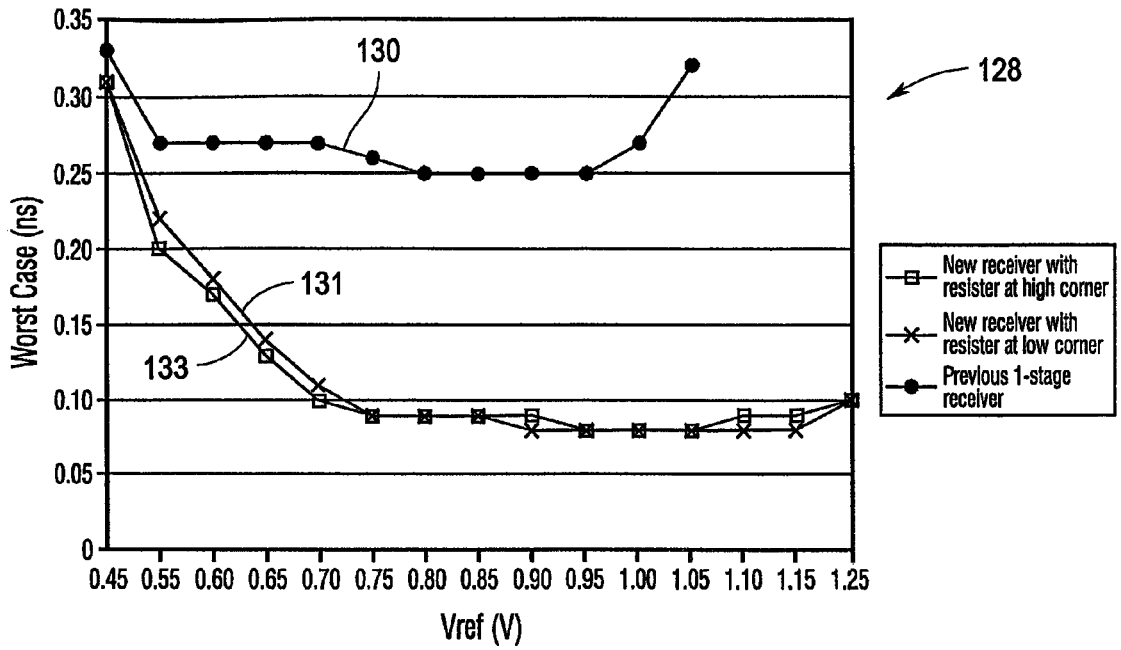
FIG. 6 illustrates an exemplary simulation result showing plots of the difference of the rising and falling delays in the output signal in the 1-stage buffer of FIG. 2 and in the 2-stage buffer of FIG. 4 when the input signal has a reduced swing.
Figure 7:
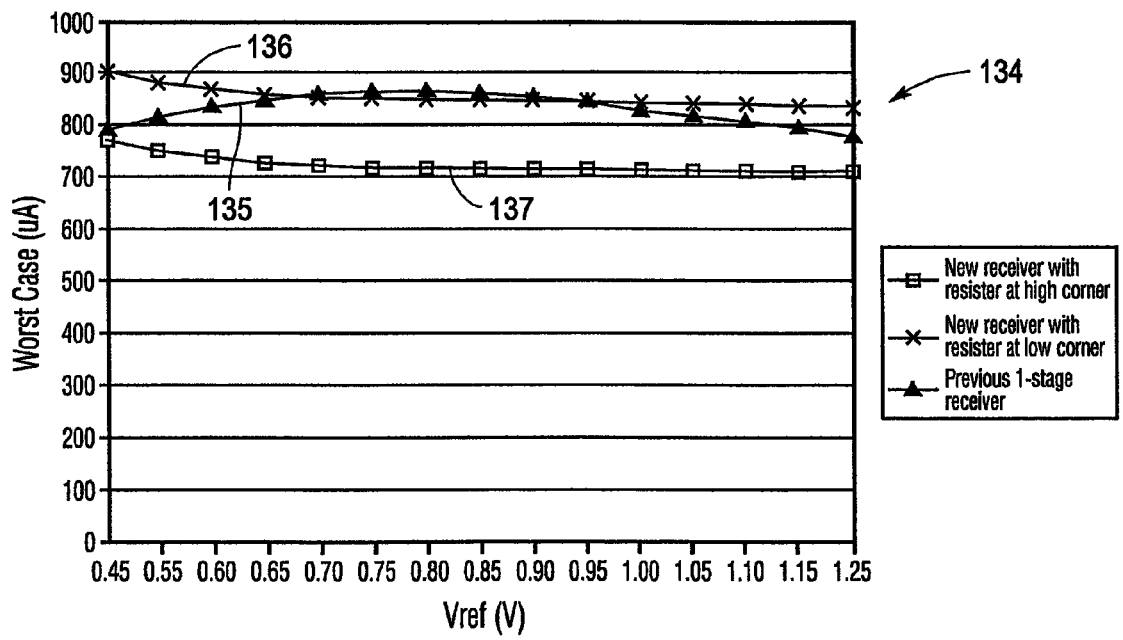
FIG. 7 is another simulation result showing exemplary plots of current consumption at high Vcc in the 1-stage buffer of FIG. 2 and in the 2-stage buffer of FIG. 4.

When PVT varies, the center voltage as well as signal swing (from a given Vref) of the Diff_Out signal 118 varies as can be seen from a comparison of the waveforms 118-1 and 118-2 in FIG. 5. Because of the circuit configuration of the receiver 70, the Duff Out signal 118 is more centered to the switch point of the inverter 58 even when PVT changes. This allows the inverter 58 to track the changes in Diff_Out 118. Therefore, as mentioned before, the output signal 120 has more symmetrical rising and falling delays, especially in case of reduced-swing inputs (Vin 43). The symmetrical rising and falling time delays in the resulting output signal 120 can be seen from a comparison of the rising and falling edges in the waveforms 120-1 and 120-2. As is known in the art, in one embodiment, the "rising time delay" may be defined as the time delay required before a signal's change of state to a logic "high" or "1" level from a logic "low" or "0" level is recognized, i.e. a Vref value is achieved after the change has started. Similarly, in one embodiment, the "falling time delay" may be defined as the time delay required before a signal's change of state to a logic "low" or "0" level from a logic "high" or "1" level is recognized, i.e. a Vref value is achieved after the change has started. A comparison of the signal plots in FIGS. 3 and 5 indicates the more controlled and centered nature of the Diff_Out signal 118 (waveforms 118-1 and 118-2 in FIG. 5) in the embodiment of FIG. 4 when a reduced-swing input (Vin) is received and PVT changes are present. Further, a comparison of the output plots 66-1 and 66-2 with the plots 120-1 and 120-2 clearly shows the more symmetrical rising and falling delays in the output 120 (as can be seen from the better alignment of the waveforms in plots 120-1 and 120-2) in the receiver circuit 70 (FIG. 4) when a reduced-swing input (e.g., Vin=Vref±75 mV) is received while PVT variations are present. Hence, there is no performance degradation in the buffer receiver circuit 70 when input signal (Vin) swing is small. FIGS. 6 and 7, discussed later hereinbelow, provide further plots comparing performances of the receiver circuits 34 (FIG. 2) (1-stage receiver) and 70 (FIG. 4) (2-stage receiver).

It is observed here that because there is an additional second pair of differential amplifiers 80, 82 in the buffer receiver circuit 70 of FIG. 4 (as compared with just one pair of differential amplifiers 36, 38 in the prior art receiver circuit 34 in FIG. 2), it may be preferable to apply several current saving methods in the circuit 70 so as to obtain the same or lower power dissipation as that in the 1-stage configuration 34 in FIG. 2. For example, in one embodiment, a constant bandgap output voltage (Vbandgap of about 1.25V) may be used to control the bias current (Ibias) of the differential amplifier pair 76, 78 in the first stage 72. In FIG. 4, such application of a bandgap voltage (Vbandgap) is shown using a bias network of PMOS transistors 123-124, NMOS transistors 122, 125, and the bias resistor (Rbias) 126. The bandgap voltage may be applied to the gate terminal of NMOS 122 whose source is connected to ground through Rbias 126 and whose drain is connected to Vcc through the PMOS 123. The gates of PMOS 123124 may be connected to the gate of the bias transistor PMOS 87 in P-diff 76 as shown in FIG. 4. On the other hand, the gate of NMOS 125 may be connected to the gate of NMOS 101 in N-diff 78 to supply the bias current as shown in FIG. 4. Other circuit connections among the transistors 122-125 are as shown in FIG. 4 and not explained in more detail herein for the sake of brevity.

The bias current (Ibias) of each differential amplifier 76, 78 in the first stage 72 may be given by the following equation:

$$Ibias=(Vbandgap-Vth)/Rbias=(1.25V-Vth)/Rbias \quad (1)$$

where "Vth" represents the threshold voltage of NMOS 122. It is seen from equation (1) that the bias current (Ibias) remains almost constant even when there are changes in the supply voltage (Vcc) because of the use of the constant bandgap voltage (Vbandgap) to supply the necessary bias current. The biasing current in the second stage differential amplifier pair 74 may also be reduced or limited by adding resistors R1 (between Vcc and the source terminal of bias PMOS 110 in P-diff 80) and R2 (between ground and the source terminal of bias NMOS 116 in N-diff 82). Further, the "cross"-coupled nature of the connection structure between differential pairs in the first stage 72 and second stage 74 (i.e., P-diff 76 outputs as inputs to N-diff 82, and N-diff 78 outputs as inputs to P-diff 80) may additionally avoid the second stage differential pair biasing current from going too high. The common mode input voltage of the second stage differential pair 74 is controlled by Ibias and the transistors in the first stage differential pair 72. Because of the stable biasing current (Ibias) in the first stage 72, the common mode input voltage of the second stage 74 may also remain relatively stable. The relatively stable common mode thus avoids the second stage biasing current from going too high. Furthermore, as discussed hereinbefore, the swing of the first stage output (i.e., signals 92-93 and 102-103) is also limited or controlled. This also helps to keep the biasing current low in the second stage 74.

FIG. 6 illustrates an exemplary simulation result 128 showing plots of the difference of the rising and falling delays in the output signal in the 1-stage buffer of FIG. 2 (i.e., the output signal 66) and in the 2-stage buffer of FIG. 4 (i.e., the output signal 120) when the input signal (Vin 43) has a reduced swing. In FIG. 6, the simulation results of worst case timing difference between the rising delay and falling delay ('Rising delay–Falling delay') are plotted on the y-axis against a range of reference voltages (Vref 41) on the x-axis. The simulation for each circuit configuration 34 and 70 is performed for different PVT corners (SS, SF, FS, and FF) and for a range of operating temperatures (−25° C., 30° C., and 110° C.) with Vcc=1.7V, and Vin having a high clock speed (clock period of 1.2 ns), a slow slew rate of 0.33 V/ns and an ultra-tight voltage swing of Vref±75 mV. The plot 130 in FIG. 6 represents the performance of the prior art input receiver circuit 34 of FIG. 2, whereas plots 131 and 133 depict the performance of the input receiver circuit 70 (FIG. 4) according to one embodiment of the present disclosure.

In FIG. 6, the plot 131 relates to a situation where the values of the resistors are chosen for the low corner, whereas the plot 133 represents the situation where the values of the resistors are chosen for the high corner. It is seen from a comparison of the plots 130 and 133 in FIG. 6 that the difference of rising and falling delays in the output 66 in the receiver circuit 34 of FIG. 2 is very large (close to 300 ps) when Vref is around ½ Vcc, when the input (Vin) swing is tight (Vref±75 mV) at a high clock speed (tck=1.2 ns), and when PVT changes. On the other hand, the input buffer receiver circuit 70 performs significantly better as can be seen from plots 131 and 133. The delay difference ('Rising delay−Falling delay|) in the output signal 120 in circuit 70 is less than 100 ps in the most of the useful Vref range (e.g., Vref around ½ Vcc).

FIG. 7 is another simulation result 134 showing exemplary plots 135-137 of current consumption at high Vcc in the 1-stage buffer 34 of FIG. 2 and in the 2-stage buffer 70 of FIG. 4. In FIG. 7, the simulation results of worst case current consumption are plotted on the y-axis against a range of reference voltages (Vref 41) on the x-axis. The simulation for each circuit configuration 34 and 70 is performed for different PVT corners (SS, SF, FS, and FF) and for a range of operating temperatures (−25° C., 30° C., and 110° C.) with Vcc=1.7V, and Vin having a high clock speed (clock period of 1.2 ns), a faster slew rate of 1.11 V/ns and a relatively large voltage swing of Vref±150 mV. The worst case current consumption (in microamperes) on the y-axis represents the total operating current (Icc) consumption including standby currents. The plot 135 in FIG. 7 represents the performance of the prior art input receiver circuit 34 of FIG. 2, whereas plots 136-137 depict the performance of the input receiver circuit 70 (FIG. 4) according to one embodiment of the present disclosure.

In FIG. 7, the plot 136 relates to a situation where the values of the resistors are chosen for the low corner, whereas the plot 137 represents the situation where the values of the resistor are chosen for the high corner. It is seen from a comparison of the plots 135-137 in FIG. 7 that the operating current consumption (at nominal Vref of 0.85V) in the receiver 70 of FIG. 4 is substantially similar or less than the current consumption in the receiver 34 of FIG. 2, despite the two-stage larger structure for the receiver 70 in FIG. 4. Thus, it is observed that the input receiver circuit 70 according to one embodiment of the present disclosure does not expend additional current (and power), even at high Vcc and larger input swings, despite its bigger size. The performance of the receiver circuit 70 is thus similar or comparable to that of the prior art circuit 34 when input swing is wide.

Figure 1:
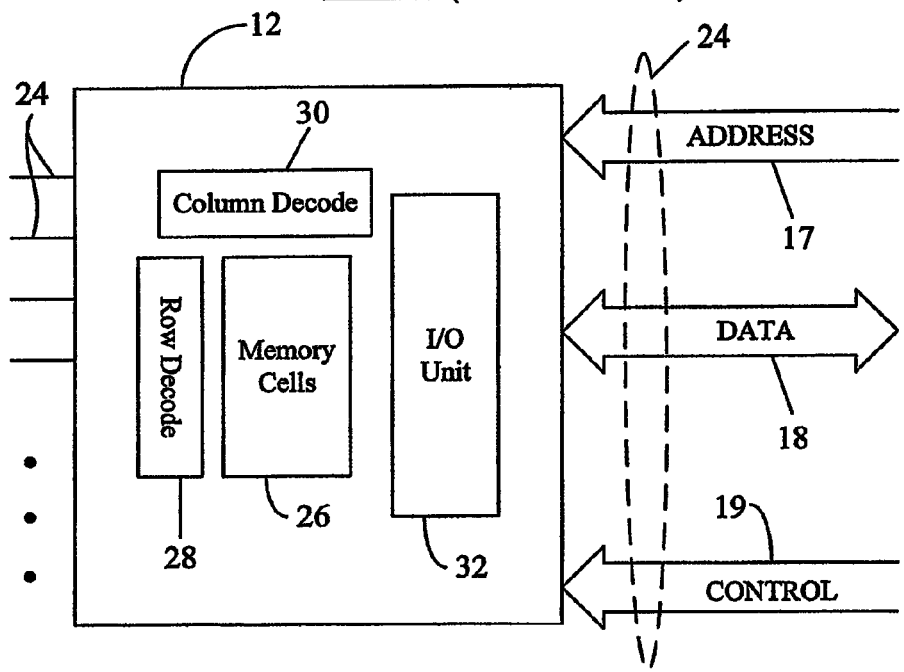
FIG. 1 is a simplified block diagram showing a memory chip or memory device.
Figure 8:
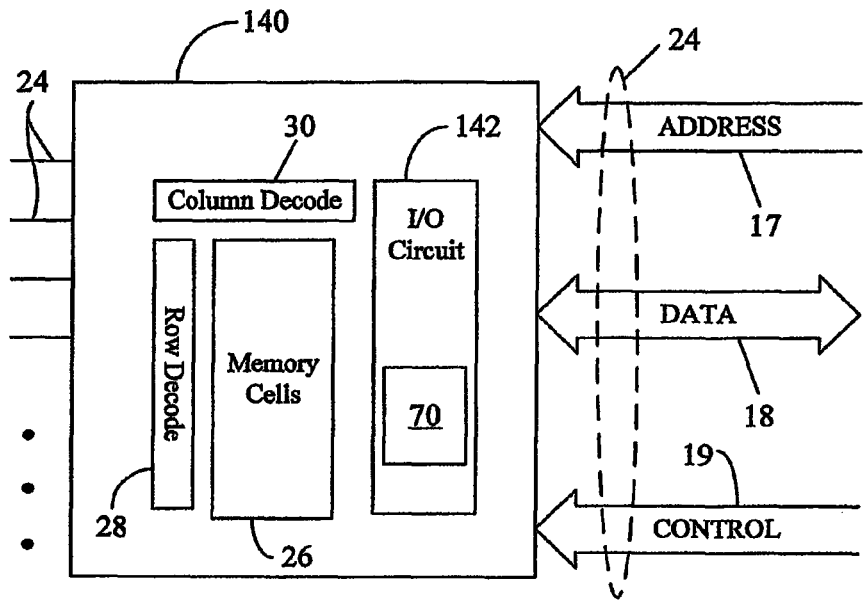
FIG. 8 is a simplified block diagram showing a memory chip that employs the circuit configuration of FIG. 4 as part of an I/O circuit in the memory chip.

FIG. 8 is a simplified block diagram showing a memory chip 140 that employs the circuit configuration 70 of FIG. 4 as part of an I/O circuit 142 in the memory chip 140. Thus, the I/O circuit 142 in FIG. 8 is illustrated to include the circuit 70. The memory chip 140 can be a dynamic random access memory (DRAM) or another type of memory circuits such as SRAM (Static Random Access Memory) or Flash memories. Furthermore, the DRAM could be a synchronous DRAM commonly referred to as S GRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 140 is a DDR DRAM operating at a clock frequency of 333 MHz and an I/O data rate of 667 MHz. It is noted here that although other elements in the memory chip 140 are designated with the same reference numerals as those given in FIG. 1, it may be possible that those components having same reference numerals may not be identical in the memories 12 and 140. For example, the row and column decode logic 28, 30, respectively, in the memory chip 140 may be different from the similar elements shown in chip 12 to take into account the outputs 120 generated by the receiver circuit 70 in the I/O unit 142, especially when reduced-swing inputs are received by the memory chip 140. However, for the sake of simplicity, units with similar functionality are denoted by same reference numerals in FIGS. 1 and 8.

Figure 9:
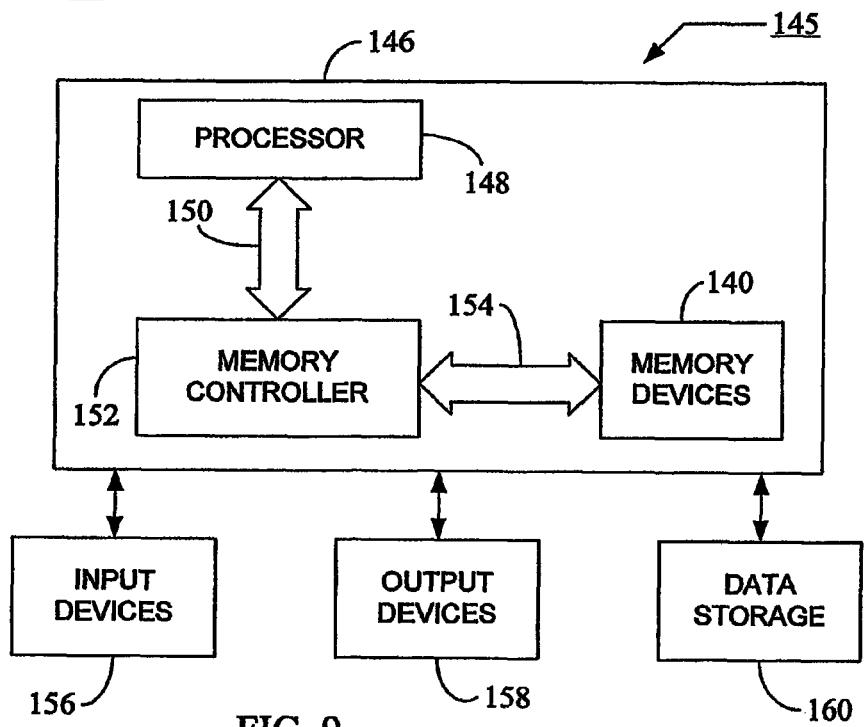
FIG. 9 is a block diagram depicting a system in which one or more memory chips illustrated in FIG. 8 may be used.

FIG. 9 is a block diagram depicting a system 145 in which one or more memory chips 140 illustrated in FIG. 8 may be used. The system 145 may include a data processing unit or computing unit 146 that includes a processor 148 for performing various computing functions, such as executing specific software to perform specific calculations or data processing tasks. The computing unit 146 also includes a memory controller 152 that is in communication with the processor 148 through a bus 150. The bus 150 may include an address bus (not shown), a data bus (not shown), and a control bus (not shown). The memory controller 152 is also in communication with a set of memory devices 140 (i.e., multiple memory chips 140 of the type shown in FIG. 8) through another bus 154 (which may be similar to the bus 24 shown in FIG. 8). Each memory device 140 may include appropriate data storage and retrieval circuitry (not shown in FIG. 9) as shown in FIG. 8. The processor 148 can perform a plurality of functions based on information and data stored in the memories 140.

The memory controller 152 can be a microprocessor, digital signal processor, embedded processor, micro-controller, dedicated memory test chip, a tester platform, or the like, and may be implemented in hardware or software. The memory controller 152 may control routine data transfer operations to/from the memories 140, for example, when the memory devices 140 are part of an operational computing system 146. The memory controller 152 may reside on the same motherboard (not shown) as that carrying the memory chips 140. Various other configurations of electrical connection between the memory chips 140 and the memory controller 152 may be possible. For example, the memory controller 152 may be a remote entity communicating with the memory chips 140 via a data transfer or communications network (e.g., a LAN (local area network) of computing devices).

The system 145 may include one or more input devices 156 (e.g., a keyboard or a mouse) connected to the computing unit 146 to allow a user to manually input data, instructions, etc., to operate the computing unit 146. One or more output devices 158 connected to the computing unit 146 may also be provided as part of the system 145 to display or otherwise output data generated by the processor 148. Examples of output devices 158 include printers, video terminals or video display units (VDUs). In one embodiment, the system 145 also includes one or more data storage devices 160 connected to the data processing unit 146 to allow the processor 148 to store data in or retrieve data from internal or external storage media (not shown). Examples of typical data storage devices 160 include drives that accept hard and floppy disks, CD-ROMs (compact disk read-only memories), and tape cassettes. As noted before, the memory devices 140 in the computing unit 146 have the configuration illustrated in FIG. 8, i.e., each memory device 140 includes an I/O circuit 142 containing one or more input buffer receiver circuits 70.

It is observed that although the discussion given hereinbefore has been primarily with reference to memory devices, it is evident that the input receiver circuit configuration 70 discussed hereinbefore with reference to FIG. 4 may be employed, with suitable modifications which may be evident to one skilled in the art, in any non-memory electronic device that may employ a signal buffer circuitry or I/O unit. Reduced-swing inputs to such an electronic device may be suitably accommodated using the input buffer receiver circuit 70 (or its suitable variation) discussed hereinabove or a methodology similar in principle as may be evident to one skilled in the art.

The foregoing describes a high performance input buffer receiver circuit that may be used in electronic devices (e.g., memory chips) to receive and process reduced-swing and high bandwidth inputs to obtain "buffered" output signals therefrom with symmetrical rising and falling delays, and without additional current dissipation over previous receiver circuits. The receiver circuit provides a better performance over prior circuits when the input signal swing is small, but also provides similar or comparable performance over prior circuits when input signal swing is wide. The new receiver circuit may include two stages of differential amplifier pairs (i.e., a total of 4 separated differential amplifiers) with each of the two differential amplifiers in the first stage being separately connected through interconnects to a corresponding differential amplifier in the second stage. The P-diff and N-diff differential amplifiers in the first stage convert the single-ended input signal to a full-differential signal, which is then converted back to the single-ended output signal by the P-diff and N-diff pair in the second stage. The outputs of the first stage P-diff are connected to the inputs of the second stage N-diff and the outputs of the first stage N-diff are connected to the inputs of the second stage P-diff, thereby creating a "cross" coupled structure. Various current saving and biasing methods may also be employed to keep the operating current the same or lower than the previous receiver circuit designs.

Figure 10:
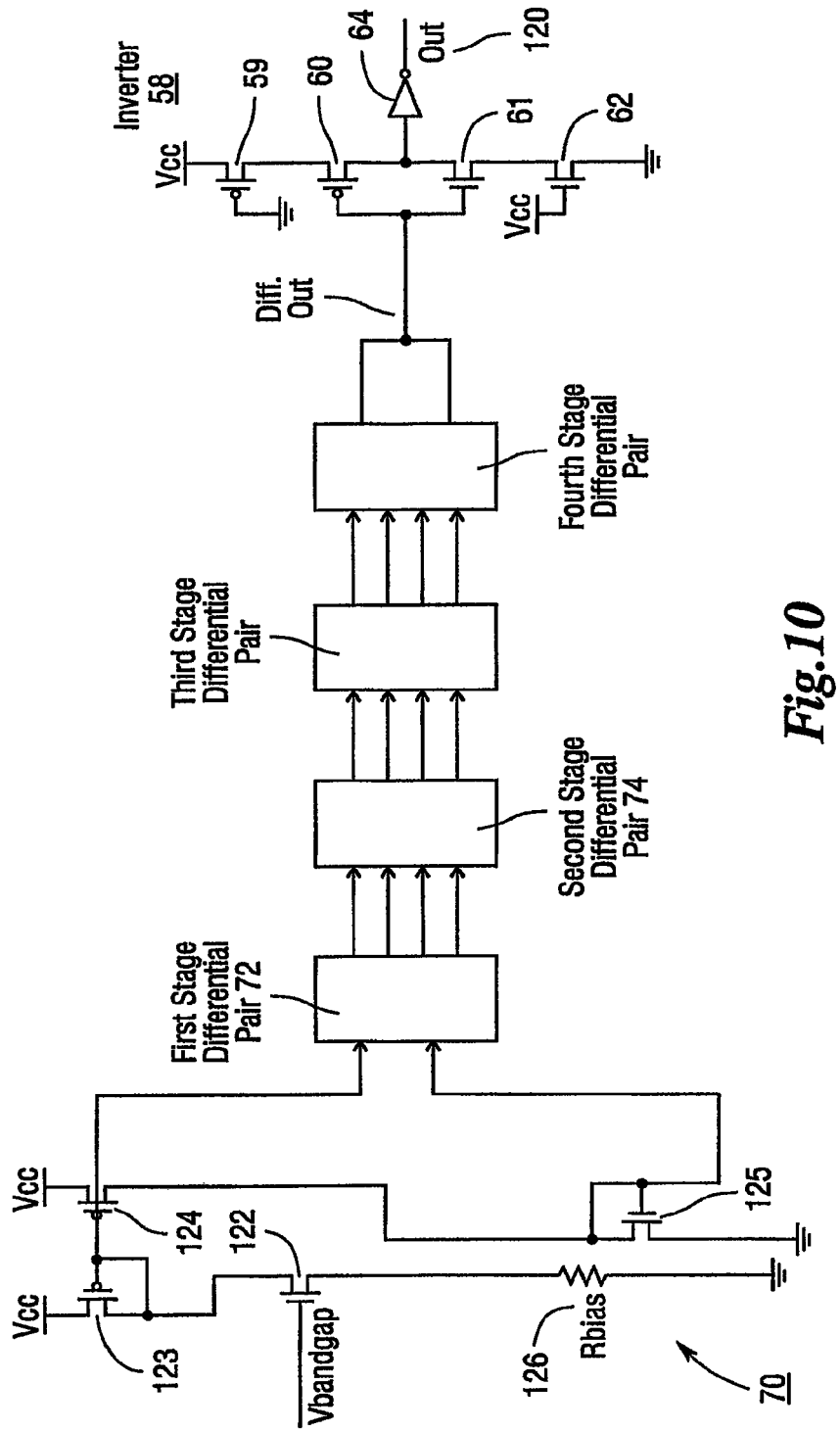
FIG. 10 depicts another exemplary circuit configuration according to another embodiment of the present disclosure for a high performance input receiver circuit for reduced-swing inputs.

While the disclosure has been described in detail and with reference to specific embodiments thereof, it will be apparent to one skilled in the art that various changes and modifications can be made therein without departing from the spirit and scope of the embodiments. For example, although the previous discussion is directed to particular configurations involving P and N type differential amplifiers, those of ordinary skill in the art will recognize that any combination of just P type differential amplifiers, just N type differential amplifiers, or combinations of P and N type differential amplifiers, as well as the number of differential amplifier stages as shown in FIG. 10, may be employed using the concepts disclosed herein. Thus, it is intended that the present disclosure cover the modifications and variations of this disclosure provided they come within the scope of the appended claims and their equivalents.

What is claimed is:

1. A method of generating a combined output signal, comprising:
   converting a single-ended input signal into first and second differential signals using a first pair of differential amplifiers, wherein the second differential signal is isolated from the first differential signal and wherein the first and second differential signals are based, at least in part, on a same reference signal;
   applying the first and second differential signals to a second pair of differential amplifiers to generate first and second output signals including providing the first differential signal from a P-type differential amplifier to an N-type differential amplifier and providing the second differential signal from an N-type differential amplifier to a P-type differential amplifier, wherein each of the second pair of differential amplifiers is configured to swing between first and second supply voltages; and
   combining the first and second output signals to generate the combined output signal.

2. The method of claim 1, wherein the combined output signal s single-ended signal.

3. The method of claim 1, wherein the first pair of differential amplifiers has a first gain and the second pair of differential amplifiers has a second gain, wherein the second gain is larger than the first gain.

4. The method of claim 1, wherein the first pair of differential amplifiers is configured to have a relatively constant signal swing.

5. The method of claim 1, further comprising:
   before said converting the differential input signals, providing a bandgap voltage to the first pair of differential amplifiers.

6. The method of claim 1, wherein a bias current provided to the first pair of differential amplifiers is controlled, at least in part, by a resistor.

7. The method of claim 1, wherein the second pair of differential amplifiers has a common mode input voltage based, at least in part, on a bias current.

8. A method, comprising:
   providing, with a first pair of differential amplifiers, first and second differential signals responsive, at least in part, to receipt of a single-ended input signal, wherein the first and second differential signals are based, at least in part, on a same reference signal;
   providing the first and second differential signals to a second pair of differential amplifiers including providing the first differential signal from a P-type differential amplifier to an N-type differential amplifier and providing the second differential signal from an N-type differential amplifier to a P-type differential amplifier, wherein individual ones of the second pair of differential amplifiers are coupled between first and second supply voltages in parallel; and
   providing first and second output signals from the second pair of differential amplifiers to a node.

9. The method of claim 8, further comprising:
   combining the first and second output signals at the node to generate a combined output signal.

10. The method of claim 9, wherein the combined output signal is single-ended.

11. The method of claim 8, wherein the second pair of differential amplifiers has a common mode input voltage based, at least in part, on a threshold voltage and a drain-source current.

12. The method of claim 8, wherein the first pair of differential amplifiers has a first gain and the second pair of differential amplifiers has a second gain, wherein the second gain is larger than the first gain.

13. The method of claim 8, further comprising:
   providing the input signal to the first pair of differential amplifiers with an input buffer.

14. The method of claim 8, wherein the first pair of differential amplifiers are separated.

15. The method of claim 8, wherein a P-type differential amplifier of the first pair is coupled to the N-type differential amplifier of the second pair and N-type differential amplifier of the first pair is coupled to the P-type differential amplifier of the second pair.

16. An apparatus, comprising:
   a first set of differential amplifiers including a first P-type differential amplifier and a first N-type differential amplifier, the first P-type differential amplifier configured to provide a first differential signal, wherein the first and second differential signals are based, at least in part, on a same reference signal;

a second set of differential amplifiers including a second P-type differential amplifier and a second N-type differential amplifier, the second P-type differential amplifier configured to receive the second differential signal and the second N-type differential amplifier configured to receive the first differential signal, wherein the second set of differential amplifiers is further configured to provide a plurality of output signals responsive, at least in part, to receipt of the first and second differential signals; and wherein the differential amplifiers of the second set are separated differential amplifiers.

17. The apparatus of claim 16, further comprising:
a receiver circuit coupled to the first set of differential amplifiers and configured to provide the input signal to the first set of differential amplifiers.

18. The apparatus of claim 17, wherein the receiver circuit is further configured to control a bias current of the first set of differential amplifiers based, at least in part, on a bandgap voltage.

19. The apparatus of claim 16, wherein a bias current for the first set of differential amplifiers is based, at least in part, on a resistance of a bias resistor.

20. The apparatus of claim 16, wherein the differential amplifiers of the first set are separated and the differential amplifiers of the second set are separated.

21. The apparatus of claim 16, wherein the first set of differential amplifiers are configured to have a relatively constant signal swing.

22. The apparatus of claim 16, wherein the first set of differential amplifiers comprises first and second differential amplifiers and the second set of differential amplifiers comprises third and fourth differential amplifiers, wherein the first differential amplifier is coupled to the third differential amplifier and the second differential amplifier is coupled to the fourth differential amplifier.

* * * * *

UNITED STATES PATENT AND TRADEMARK OFFICE
CERTIFICATE OF CORRECTION

PATENT NO. : 8,884,690 B2  
APPLICATION NO. : 13/398041  
DATED : November 11, 2014  
INVENTOR(S) : Dong Pan et al.

Page 1 of 1

It is certified that error appears in the above-identified patent and that said Letters Patent is hereby corrected as shown below:

In the Claims

Column 16, line 7, Claim 2, delete "signal s" and insert -- signal is a --, therefor.

Column 16, line 60, Claim 15, delete "wherein a" and insert -- wherein --, therefor.

Column 17, line 2, Claim 16, delete "signal," and insert -- signal and the first N-type differential amplifier configured to provide a second differential signal, --, therefor.

Signed and Sealed this  
Twenty-fourth Day of February, 2015

Michelle K. Lee  
*Deputy Director of the United States Patent and Trademark Office*